United States Patent [19]

Garner

[11] 4,418,480
[45] Dec. 6, 1983

[54] MAGNETIC HEADING REFERENCE

[75] Inventor: H. Douglas Garner, Newport News, Va.

[73] Assignee: The United States of America as represented by the Administrator of the National Aeronautics and Space Administration, Washington, D.C.

[21] Appl. No.: 367,187

[22] Filed: Apr. 9, 1982

[51] Int. Cl.$^3$ ............................................. G01C 17/30
[52] U.S. Cl. ........................................ 33/349; 33/356; 33/361; 33/DIG. 3
[58] Field of Search ............ 33/349, 356, 361, DIG. 3; 318/647

[56] References Cited

U.S. PATENT DOCUMENTS

| | | | |
|---|---|---|---|
| 2,158,500 | 5/1939 | Guerra | 33/361 |
| 2,671,275 | 3/1954 | Burns, Jr. | 33/361 |
| 3,096,503 | 7/1963 | Iddings | 340/26 |
| 3,425,648 | 2/1969 | Wipff et al. | 244/77 |
| 3,516,173 | 6/1970 | Koerner | 33/349 |
| 3,541,853 | 11/1970 | Anderson | 33/356 |
| 3,596,069 | 7/1971 | Burt | 73/178 R |
| 3,696,518 | 10/1972 | Leat | 33/357 |
| 3,705,980 | 12/1972 | Brickner et al. | 235/186 |
| 3,888,201 | 6/1975 | Zuvela | 33/361 |
| 3,906,641 | 9/1975 | Freeman | 33/349 |
| 3,919,961 | 11/1975 | McDougal | 318/647 |
| 3,943,763 | 3/1976 | Garner | 33/356 |
| 4,006,631 | 2/1977 | Garner | 73/178 R |
| 4,112,754 | 9/1978 | Suminsby | 73/178 R |
| 4,112,755 | 9/1978 | Sullivan | 73/178 R |
| 4,114,436 | 9/1978 | Suminsby | 73/178 R |
| 4,116,057 | 9/1978 | Sullivan | 33/356 |

Primary Examiner—Richard R. Stearns
Attorney, Agent, or Firm—Howard J. Osborn; John R. Manning; William H. King

[57] ABSTRACT

Devices for vectorially summing two signals. In a first embodiment (FIG. 3) the vectorial summation is implemented by a mechanical sin/cos mechanism in which a crank 22 drives two linear potentiometers 27 and 29, 90° out of phase. In a second embodiment (FIG. 6) a polarized light resolver generates the sin and cos functions. In a third embodiment (FIG. 8) a printed circuit resolver generates the sin and cos functions.

20 Claims, 9 Drawing Figures

MAGNETIC HEADING REFERENCE

ORIGIN OF THE INVENTION

The invention described herein was made by an employee of the U.S. Government and may be manufactured and used by or for the Government for governmental purposes without the payment of any royalties thereon or therefor.

BACKGROUND OF THE INVENTION

The invention relates generally to devices for vectorially combining electrical signals from two or more sources, and more specifically concerns devices known as "resolvers" which vectorially sum the output signals from two or more magnetometers mounted in a vehicle, such as an aircraft, in such a way that the resultant signal is a function of the error in heading of the vehicle.

The invention concerns the design of resolvers which are generally lighter and more economical to fabricate than the conventional electromagnetic type. In aircraft or other vehicles, it is desirable to install the compass or other magnetic heading reference at a point remote from the pilot's instrument panel to avoid stray magnetic fields from the engine and from other instruments. In the situation described here, two or more inductive magnetometers are mounted at a remote location in such a way that their sensitive axes lie in a normally horizontal plane and are disposed at an angle with respect to each other. In the simplest case, which will be used as an example, two magnetometers are mounted so that their sensitive axes lie in a horizontal plane, when the aircraft is in normal flight, and at 90° with respect to one another—one axis parallel to the direction of flight and the other at a right angle to it.

The magnetometers used are of the "flux gate" inductive type, which produce an electrical output signal proportional to the intensity of that component of the earth's magnetic field which is parallel to the sensitive axis of the magnetometer. The basic output signal is an amplitude-modulated AC carrier signal whose frequency is twice that of the excitation voltage used to excite the magnetometer, and whose phase relation to the excitation voltage indicates the polarity of the signal.

When this signal is processed by a suitable phase-sensitive demodulator, it is converted into a DC signal whose amplitude is proportional to the intensity of that component of the magnetic field parallel to the magnetometer's sensitive axis and whose polarity indicates the direction of the field with respect to the magnetometer.

Figure 1:
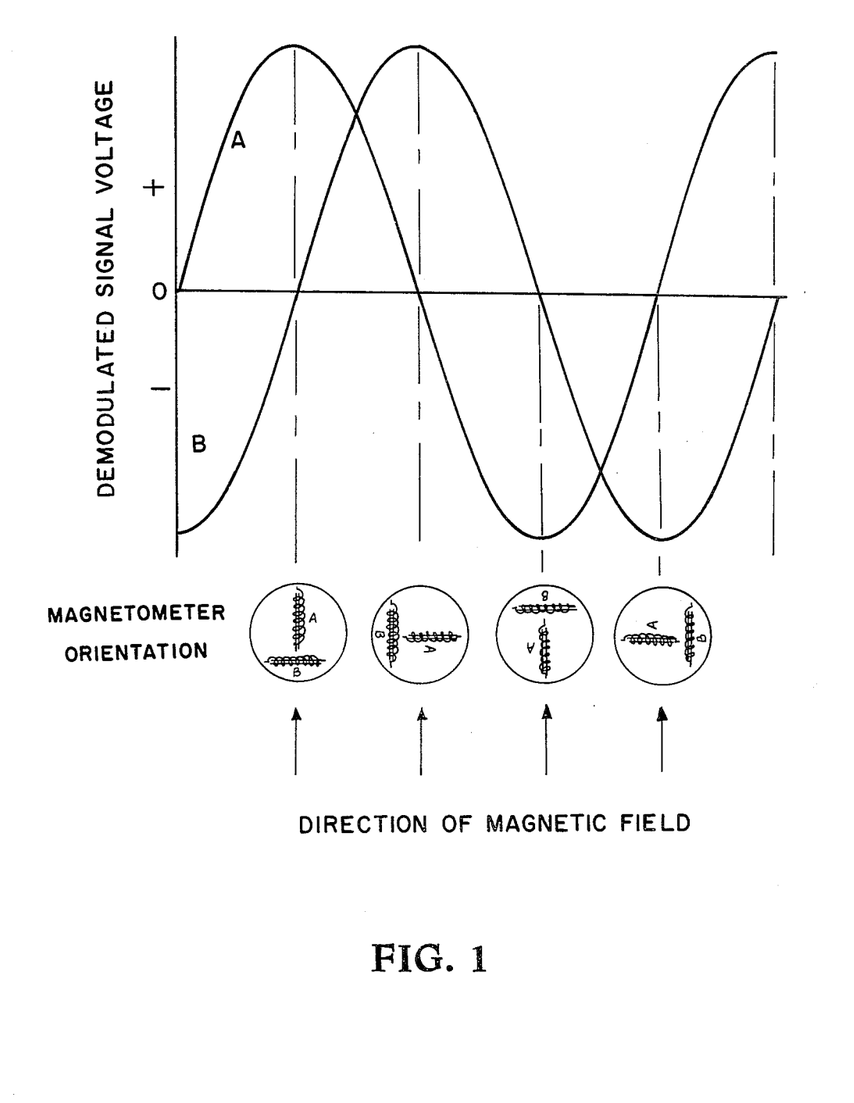
FIG. 1 is a schematic drawing for describing the operating principle of the invention.

Thus, when one of these magnetometers is rotated about a vertical axis, while its sensitive axis is maintained in a horizontal plane, the electrical output from the demodulator will produce one cycle of a sin wave for each 360° of rotation. If two such magnetometers A and B (FIG. 1) are mounted in the aircraft as previously described, and the aircraft is rotated about its vertical axis, the electrical signals from the demodulators of the respective magnetometers will produce sinusoidal waveforms A and B which will pass through one cycle for each 360° of rotation of the aircraft, and these sin waves will have a 90° phase relation to each other as shown in FIG. 1.

The problem addressed by this invention is to vectorially sum these signals from the individual magnetometers in such a way that the resultant signal will be a sinusoidal function of the heading of the vehicle, and that its phase may be manually adjusted to cross the zero axis at any desired heading of the vehicle, so that it may be used as a heading error signal for use with an automatic pilot or with a manual steering error indicator.

Figure 2:
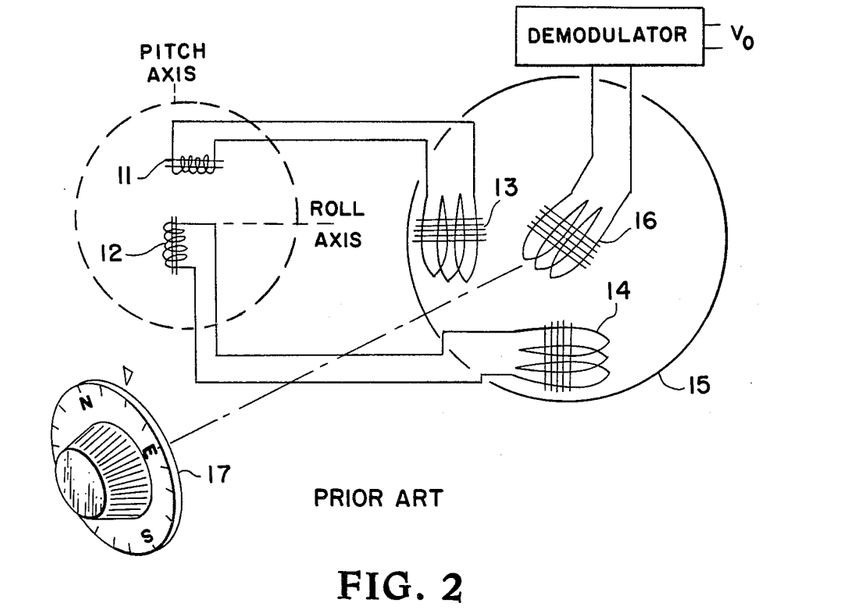
FIG. 2 is a schematic drawing of a prior art device.

FIG. 2 illustrates typical prior art in which the AC output voltages of the two magnetometers 11 and 12 are applied to the two mutually perpendicular stationary field windings 13 and 14, respectively, of a electromagnetic resolver 15. It can be see that, as the vehicle and the magnetometer assembly is rotated in the earth's magnetic field, the AC signal voltages from the two magnetometers 11 and 12 are proportional to the sin and cosine of the magnitude of the horizontal component of the earth's magnetic field. When these signal voltages are applied to the stationary windings 13 and 14 of the resolver, a composite AC magnetic field is generated within the resolver. The direction of this composite field will rotate through the same angle through which the magnetometer rotates with respect to the earth's magnetic field, and the rotatable winding 16 can be positioned by means of a calibrated dial 17 to produce a null output voltage for any particular heading of the vehicle. This voltage $V_o$ can then be used as a heading error signal in an autopilot or a visual heading error indicator.

FIG. 5 of U.S. Pat. No. 4,006,631 shows another example of prior art in which a resistive potentiometer is used for the resolver. Either the AC signal voltages or the demodulated DC signal voltages from the magnetometers are applied to diametrically opposite points on the continuous winding of the potentiometer. Two diametrically opposite movable contacts can be positioned by a calibrated dial to select the vehicle heading at which a null output voltage is obtained. In this device the potentiometer must have a continuous 360° winding, and the winding must have a nonlinear relation between resistance and angle in order to use an evenly divided dial for adjusting the desired heading.

It is an object of this invention to provide devices known as resolvers for vectorially summing the output signals from two or more magnetometers mounted on a vehicle, such as an aircraft, to produce a resultant signal which is a function of the error in heading of the vehicle.

It is another object of this invention to provide resolvers which are generally lighter and more economical to fabricate than the conventional electromagnetic type.

A further object of this invention is to vectorially sum the signals from individual magnetometers mounted on a vehicle in such a way that the resultant signal will be a sinusoidal function of the heading of the vehicle.

Other objects and advantages of this invention will become apparent hereinafter in the specification and drawings.

SUMMARY OF THE INVENTION

This invention is a device for generating a signal indicative of the difference between the actual heading and the selected heading of a vehicle. First and second magnetometers are mounted on the vehicle in a horizontal plane during normal movement of the vehicle with the sensing elements of the magnetometers at a right angle with each other. A first demodulator demodulates the output of the first magnetometer and a first inverter inverts the output of the first demodulator.

A second demodulator demodulates the output of the second magnetometer and a second inverter inverts the output of the second demodulator. A dial is calibrated in the points of a compass. A means receives the outputs of the first demodulator and the first inverter under the control of the dial for generating a signal proportional to the output of the first demodulator times the sin of the angle through which the dial is rotated. Means receives the outputs of the second demodulator and the second inverter under the control of the dial for generating a signal proportional to the output of the second demodulator times the cos of the angle through which the dial is rotated. The outputs of the last two mentioned means are summed by summing means to provide the signal indicative of the difference between the actual heading and the selected heading of the vehicle.

In a first embodiment of the invention, the vectorial summation is implemented by a mechanical sin/cos mechanism in which a crank drives a pair of conventional linear potentiometers. In a second embodiment of the invention a polarized light resolver generates the sin and cos functions of the magnetometer output signals. In this case the sin/cos functions are generated by photoresistive elements illuminated by light, the intensity of which is modified by passage of the light through linearly polarized filters. The unique characteristics of these filters permits the generation of the sin/cos functions in an extremely simple manner. In a third embodiment of the invention a capacitive resolver is produced by printed circuit techniques giving it a potential for extremely low cost, and lightweight construction.

DETAILED DESCRIPTION OF THE INVENTION

Figure 3:
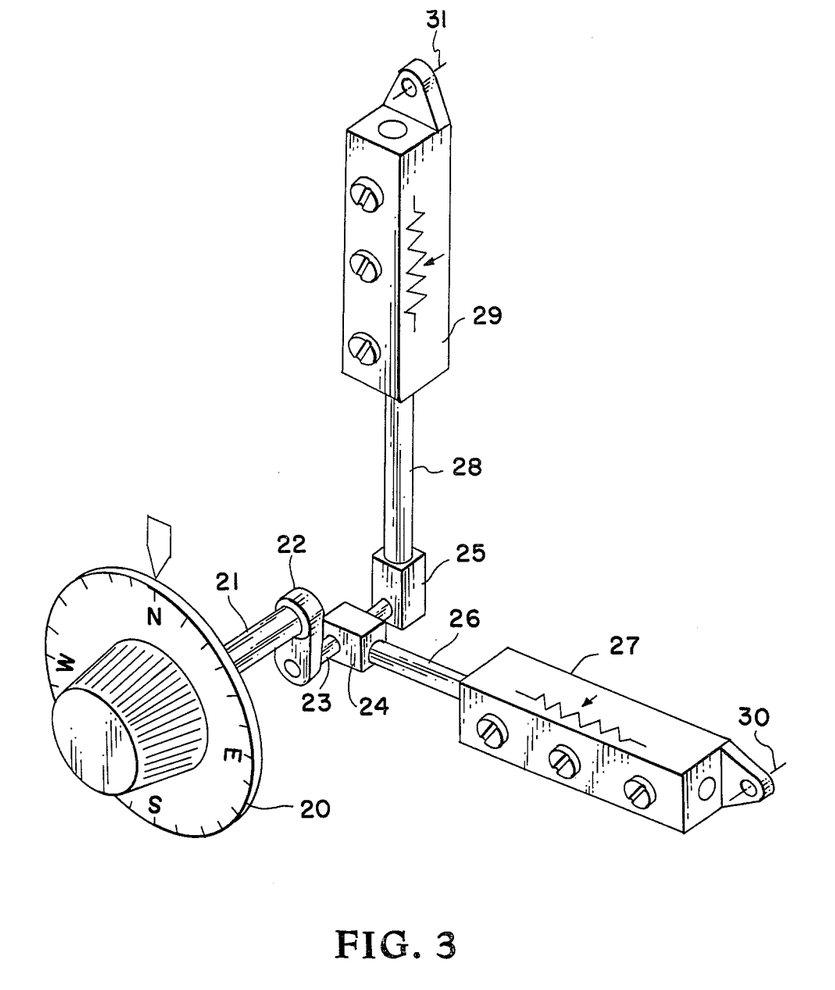
FIG. 3 is a schematic drawing of a potentiometric resolver which constitutes one embodiment of the invention.
Figure 4:
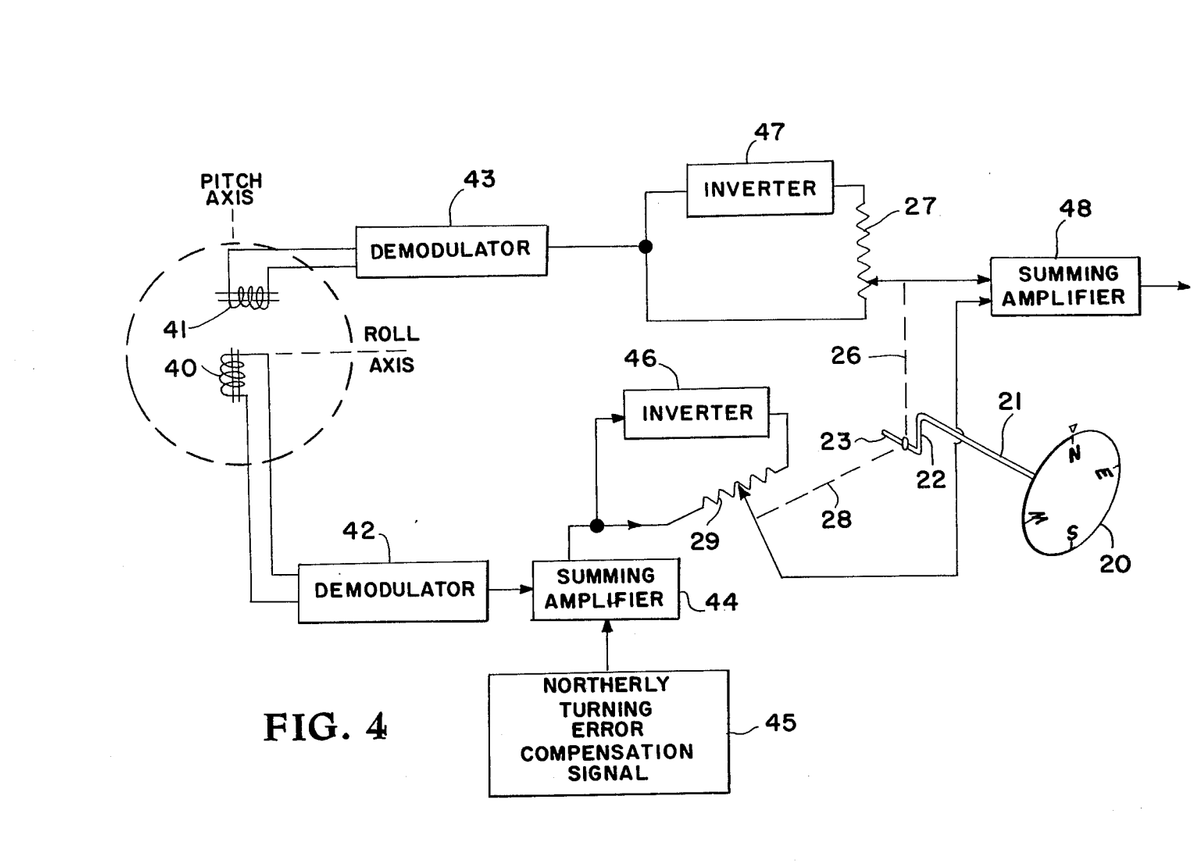
FIG. 4 is a block diagram showing the resolver disclosed in FIG. 3 connected in a typical circuit.

Turning now to one embodiment of the invention selected for illustration in FIGS. 3 and 4 of the drawings, a dial 20 is calibrated in the points of the compass. Dial 20 is attached to a shaft 21 which is fixed but is free to turn or rotate with dial 20. Shaft 21 is attached to a crank 22 which is attached to a shaft 23. A housing 24 is attached to shaft 23 and to the slider arm 26 of a linear potentiometer 27 and a housing 25 is attached to shaft 23 and the slider arm 28 of an potentiometer 29. Shaft 23 rotates in housings 24 and 25. In operation potentiometer 27 is fixed such that it will swing about an axis 30 and potentiometer 29 is fixed such that it will swing about an axis 31. Housing 24 and 25 are located on shaft 23 such that slider arms 26 and 28 are perpendicular to each other. The crank 22 offsets shaft 23 from shaft 21 one-half the length of a full scan of the slider arms 26 and 28. When dial 20 is rotated slider arm 26 is moved back and forth and slider arm 28 is moved up and down. Consequently, when signals are applied to potentiometers 27 and 28 the signals at the sliders of the potentiometers will be proportional to the applied signals times the sin and cos of the angle through which dial 20 is rotated.

As shown in FIG. 4 two magnetometers 40 and 41 are mounted on a vehicle in a horizontal plane during normal movement of the vehicle and with the sensing elements of the magnetometers at a right angle with each other. The output of magnetometer 40 is demodulated by a demodulator 42 and the output of magnetometer 41 is demodulated by a demodulator 43. The output of demodulator 42 is summed with a northerly turning error compensation signal 45 by means of a summing amplifier 44. Means for generating a northerly turning error compensation signal is disclosed in U.S. Pat. No. 4,006,631. The signal at the output of summing amplifier 44 is applied to one end of potentiometer 29 and also is inverted by an inverter 46 and applied to the other end of potentiometer 29. The output of demodulator 43 is applied to one end of potentiometer 27 and is also inverted by an inverter 47 and applied to the other end of potentiometer 27. Dial 20 is turned to the selected heading. Then the outputs from potentiometers 27 and 29 are summed by a summing amplifier 48 to produce the error signal. The error signal at the output of amplifier 48 is indicative of the difference between the selected heading as selected by dial 20 and the actual heading of the vehicle.

The simple crank mechanism illustrated in FIGS. 3 and 4 introduces small errors in the generation of the sin/cos functions because of the angles through which the potentiometers swing during the rotation of the crank. If extreme accuracy is required, these errors may be avoided by a slight modification of the calibration of the dial or by the use of more precise sin/cos mechanisms such as the Scotch yoke or the Cardan Gear mechanism.

Figure 5:
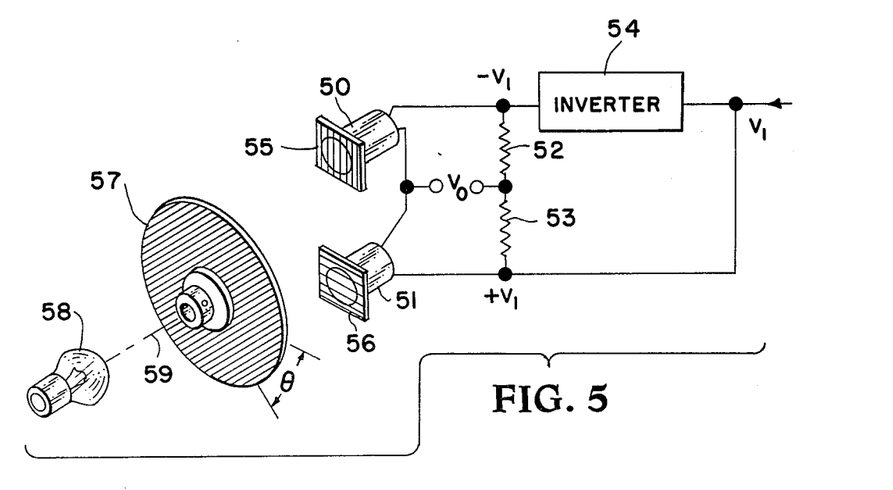
FIG. 5 is a schematic drawing of a polarized light device for generating the function $V \sin 2\theta$.

When light is passed through two sheets of linearly polarized filter material and one sheet is rotated with respect to the other the resulting intensity of the transmitted light generates an almost perfect sin function of twice the angle of rotation of the rotated sheet. FIG. 5 shows an arrangement for obtaining the product of a signal voltage times the sin or cos of twice a mechanically generated angle. Two photoconductive cells 50 and 51 are connected as two legs of a resistance bridge including resistors 52 and 53 which is excited by a signal voltage $V_1$ and its inverse obtained by means of an inverter 54. Photocell 50 is covered by a sheet of linearly polarized filter material 55 and photocell 51 is covered by a sheet of linearly polarized filter material 56 with the axis of polarization of sheets 55 and 56 being at a right angle to each other. A third sheet of linearly polarized filter material 57 is interposed between a light source 58 and the two photocells 50 and 51 and is mounted such that it may be rotated through one complete revolution. For a complete revolution, the output $V_o$ of the bridge is two complete cycles of a sin wave whose maximum aptitude is proportional to $V_1$.

Figure 6:
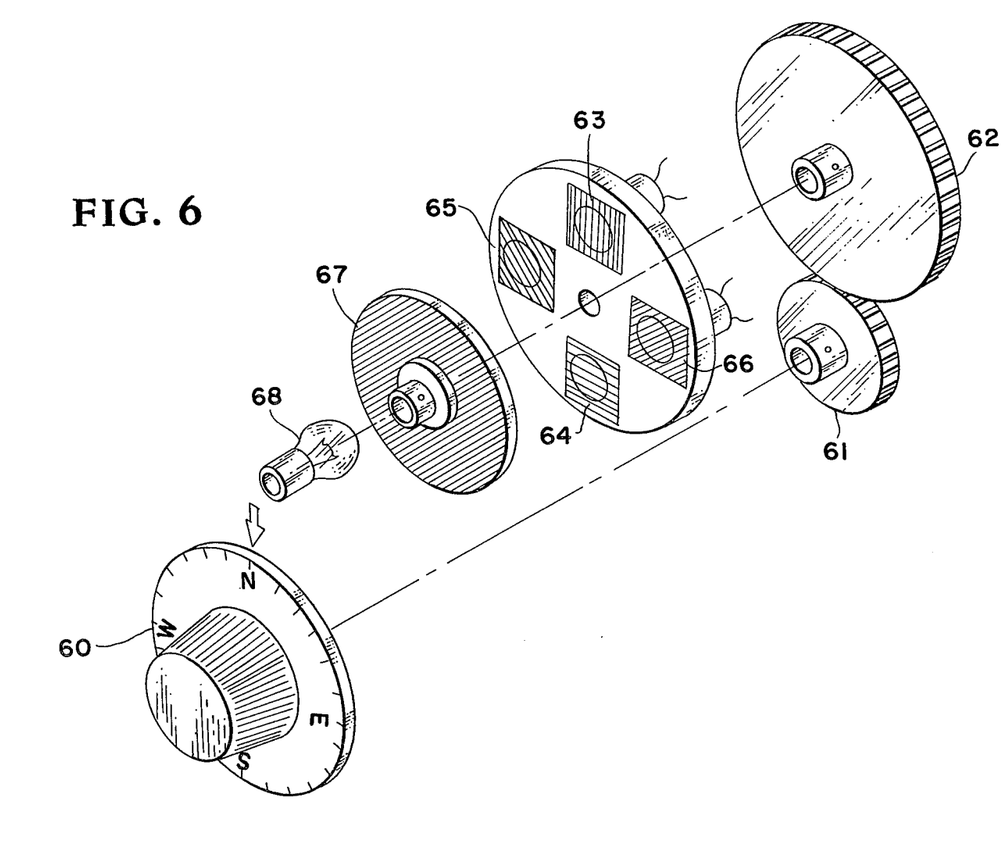
FIG. 6 is a schematic drawing of a polarized light resolver that constitutes another embodiment of the invention.

The mechanical arrangement of a complete resolver using sin function generators as is disclosed in FIG. 5, is shown in FIG. 6. A heading setting dial 60, calibrated in the points of the compass, is attached to a gear 61 such that gear 61 rotates with dial 60. Gear 61 meshes with a gear 62. The gear ratio of 62 to 61 is 2:1. Gear 62 is attached to rotate a sheet of linearly polarized filter material 67. Sheet 67 is located between a light source 68 and two pairs of linearly polarized sheets 63 and 64, and 65 and 66 with each sheet covering a different photoconductive cell. The axes of polarization of sheets 63 and 64 are perpendicular. The axes of polarization of sheets 65 and 66 are perpendicular and at 45° to the axes of polarization of sheets 63 and 64. Consequently, as dial 60 is rotated, one pair of the photocells, say 63 and 64, generates the sin function and the other pair generates the cos function as required for the resolver. Since this device characteristically generates two cycles of sin/cos wave forms per revolution of movable filter 67, the 2:1 gear ratio between gears 62 and 61 is required. For simplicity, the gearing could be omitted and the dial 60 calibrations repeated every half revolution of the dial.

Figure 7:
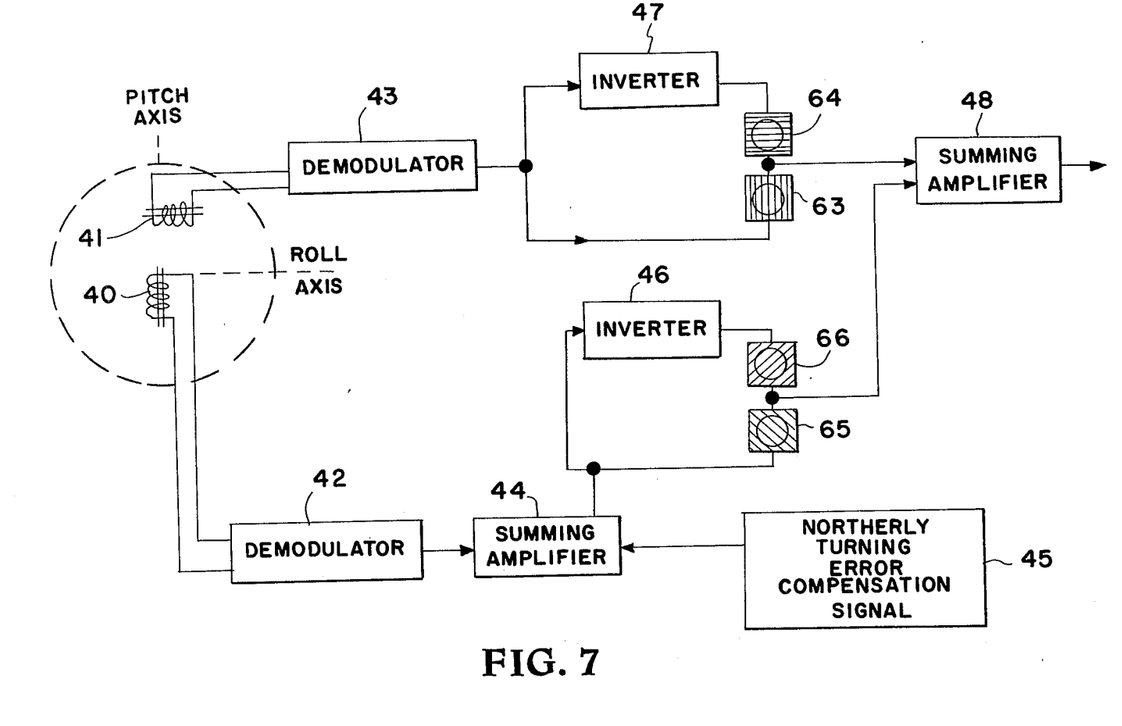
FIG. 7 is a typical circuit for the use of the resolver disclosed in FIG. 6.

The photocell or photoresistive elements associated with sheets 63, 64, 65 and 66 are connected in a circuit as shown in FIG. 7. FIG. 7 is exactly like FIG. 4 except the photoresistive elements are substituted for the potentiometers 27 and 29 as shown. Photoresistive elements 63 and 64 perform the same function as potentiometer 27 in FIG. 4 in that the signal at the junction of these two photoresistive elements is proportional to the output of demodulator 43 times the sin of the angle through which dial 60 is rotated. Photoresistive elements 65 and 66 perform the same function as potentiometer 29 in FIG. 4 in that the signal at the junction of these two photoresistive elements is proportional to the signal at the output of summing amplifier 44 times the cos of the angle through which dial 60 is rotated.

Figure 8:
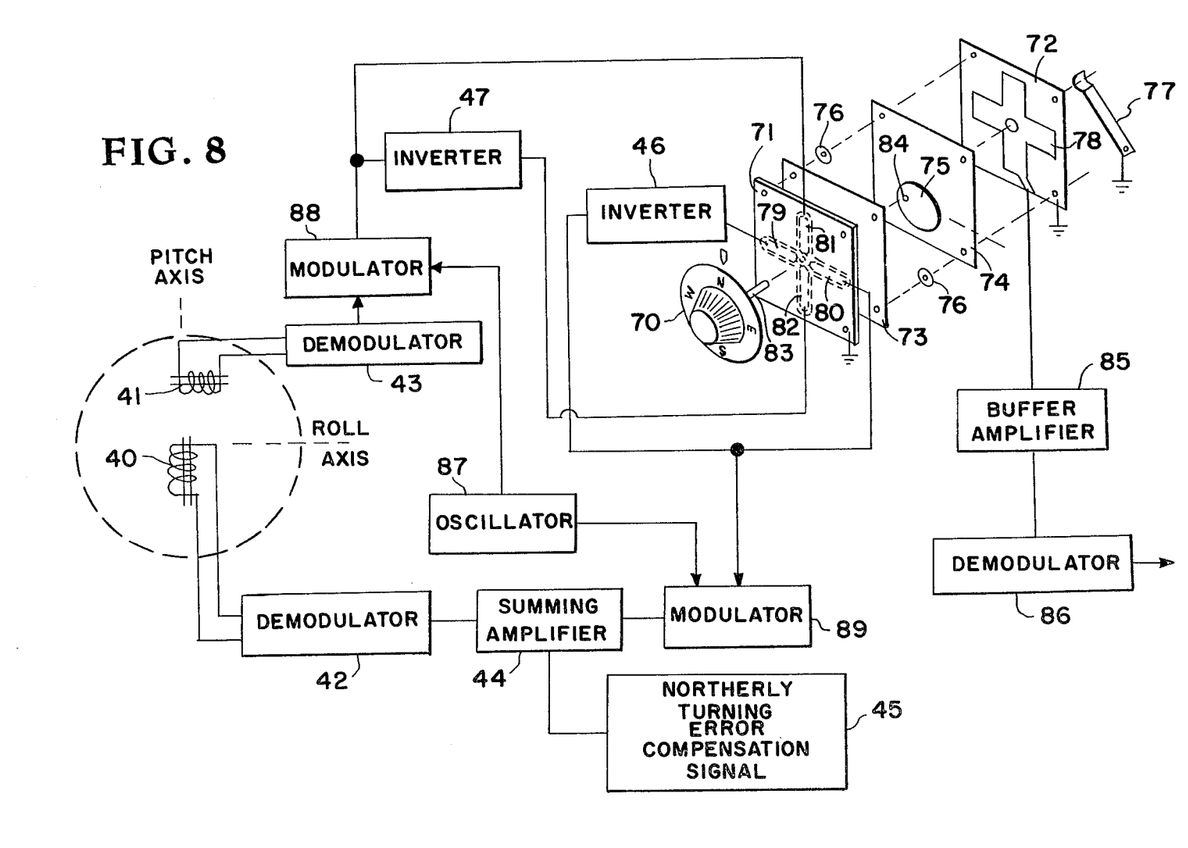
FIG. 8 is a schematic drawing of a printed circuit capacitor resolver that constitutes a further embodiment of the invention connected in a typical circuit.

A further embodiment of the invention in which a capacitive resolver is used, is shown in FIG. 8. The capacitive resolver includes a dial 70 calibrated in the points of the compass. A printed circuit board 71 has four elongated capacitor plates 79, 80, 81 and 82 etched thereon. All of these capacitor plates are electrically isolated from each other in that they do not touch. The conducting area of the printed circuit board around the capacitor plates is grounded. A second printed circuit board 72 has a capacitor plate 78 etched thereon with the conducting area around the plate grounded. The cruciform shape of capacitor plate 78 corresponds to the cruciform shape of the combined capacitor plates 79–82. A sheet of dielectric material 73, a rotatable circular metallic shield 75 and a sheet of dielectric material 74 are sandwiched between printed circuit boards 71 and 72. Spacers 76 provide a spacing between sheets 73 and 74 so that metallic shield 75 can rotate.

Dial 70 has a metallic shaft 83 attached to it which extends through printed circuit board 71, dielectric material 73, hole 84 in metallic shield 75, dielectric material 74 and printed circuit board 72, and makes contact with a grounded contact 77. Hole 84 is away from the center of metallic shield 75. Shaft 83 is attached to shield 75 and makes electrical contact therewith. Hence, shield 75 is grounded and rotates off center with the rotation of dial 70. Shaft 83 does not make electrical contact with the condenser plates on printed circuit boards 71 and 72. The output from the resolver is at capacitor plate 78 and passes through a buffer amplifier 85 and is then demodulated by a demodulator 86.

The capacitive resolver is connected into the circuit in FIG. 8 much the same as the potentiometers are connected in FIG. 4 and the photoresistive elements are connected in FIG. 7. An oscillator 87 and modulators 88 and 89 are used to modulate the outputs from the demodulators before they are applied to the capacitive resolver. Thus the output from modulator 89 is applied to capacitor plate 80 and is inverted by inverter 46 and applied to capacitor plate 79. The output from modulator 88 is applied to capacitor plate 81 and is inverted by inverter 47 and applied to capacitor plate 82. In the operation of the embodiment of the invention shown in FIG. 8 the output signal on capacitor plate 78 is proportional to the output of magnetometer 40 times the sin of angle through which dial 70 is rotated from magnetic north plus the output of magnetometer 41 times the cos of the angle through which dial 70 is rotated.

Figure 9:
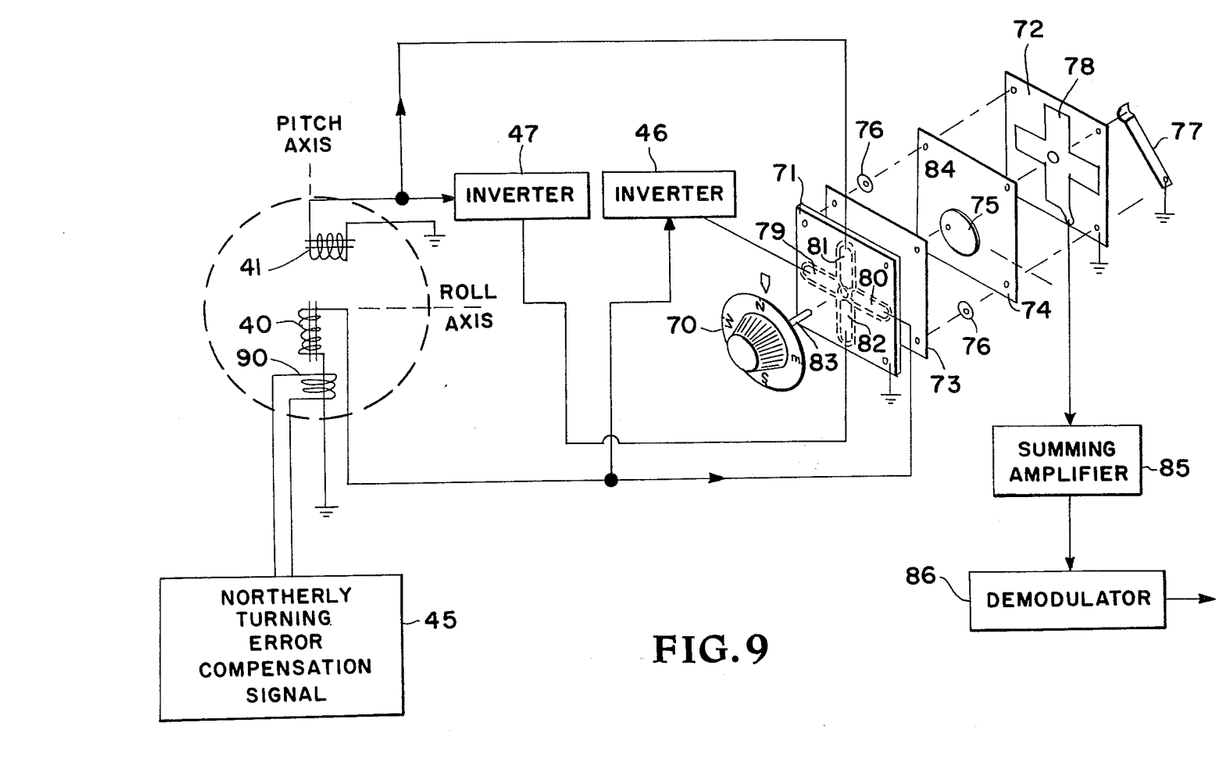
FIG. 9 discloses the printed circuit capacitor resolver shown in FIG. 8 connected in a different circuit.

The embodiment of FIG. 9 is the same as the one in FIG. 8 except that the signal at the outputs of magnetometers 40 and 41 are applied directly to the resolver thereby eliminating the demodulators and modulators. In this embodiment the northerly turning error compensation signal is added to the magnetometer output signal by means of a coil 90.

The advantage of this invention is that it provides simple, inexpensive and very uncomplicated resolvers for use in a device for generating a signal indicative of the difference between the actual heading and the selected heading of a vehicle.

What is claimed is:

1. A device for generating a signal indicative of the difference between the actual heading and the selected heading of a vehicle comprising:
    first and second magnetometers mounted on the vehicle in a horizontal plane during normal movement of the vehicle and with the sensing elements of the magnetometers at an angle with each other;
    first demodulating means for demodulating the output of said first magnetometer;
    first inverter means for inverting the output of said first demodulating means;
    second demodulating means for demodulating the output of said second magnetometer;
    second inverter means for inverting the output of said second demodulating means;
    a dial calibrated in the points of a compass for selecting the heading of the vehicle;
    means receiving the outputs of said first demodulating means and said first inverter means and under the control of said dial for generating a sin signal proportional to the output of said first demodulating means times the sin of the angle through which said dial is rotated;
    means receiving the outputs of said second demodulating means and said second inverter means and under the control of said dial for generating a cos signal proportional to the output of said second demodulating means times the cos of the angle through which said dial is rotated; and
    means for summing said sin signal and said cos signal to produce said signal indicative of the difference between the actual heading and the selected heading of the vehicle.

2. A device according to claim 1 wherein the sensing element of said first magnetometer is mounted perpendicular to the roll axis of said vehicle and the sensing of said second magnetometer element is mounted perpendicular to the sensing element of the first magnetometer.

3. A device according to claim 1 wherein a northerly turning error compensation signal is added to the output of said first demodulating means.

4. A device according to claim 1 wherein said means for generating said sin signal comprises:
   a first linear potentiometer with one end of the potentiometer connected to receive the output from said first demodulating means and with its other end connected to receive the output from said first inverter means;
   a first shaft attached to be rotated with said dial;
   a second shaft;
   a crank means attached to said first and second shafts such that the second shaft is parallel to, offset from and revolves around the centerline extended of said first shaft as the first shaft rotates; and
   means for attaching the slider arm of said first linear potentiometer to said second shaft to be controlled by the movement of said second shaft whereby the potential at the slider of said first linear potentiometer is said sin signal.

5. A device according to claim 4 wherein said means for generating said cos signal comprises:
   a second linear potentiometer with one end of the potentiometer connected to receive the output from said second demodulating means and with its other end connected to receive the output from said second inverter means; and
   means for attaching the slider arm of said second linear potentiometer to said second shaft to be controlled by the movement of said second shaft wherein the slider arms of the first and second potentiometers are perpendicular to each other whereby the potential at the slider of said second linear potentiometer is said cos signal.

6. A device according to claim 1 wherein said means for generating said sin signal comprises:
   first and second photocells connected in series with one side of the resulting series circuit connected to the output of said first demodulating means and with the other side of the series circuit connected to the output of said first inverter means;
   a first sheet of linearly polarized material covering said first photocell;
   a second sheet of linearly polarized material covering said second photocell such that its axis of polarization is perpendicular to the axis of polarization of said first sheet;
   a light source for illuminating said first and second sheets;
   a third sheet of linearly polarized material located between said light source and said first and second sheets; and
   means for rotating said third sheet through an angle proportional to the angle through which said dial is rotated whereby the signal at the junction of said first and second photocells is said sin signal.

7. A device according to claim 6 wherein said means for generating said cos signal comprises:
   third and fourth photocells connected in series with one side of the resulting series circuit connected to the output of said second demodulating means and with the other side of the series circuit connected to the output of said second inverter means;
   said third and fourth photocells being in the path of said light source with said third sheet being between said light source and said third and fourth photocells;
   a fourth sheet of linearly polarized material covering said third photocell such that its axis of polarization makes a 45° angle with the axes of polarization of said first and second sheets; and
   a fifth sheet of linearly polarized material covering said fourth photocell such that its axis of polarization is perpendicular to the axis of polarization of said fourth sheet whereby the signal at the junction of said third and fourth photocells is said cos signal.

8. A device according to claim 1 wherein said means for generating said sin signal comprises:
   means for modulating the outputs of said first and second demodulating means before the outputs of the demodulating means are utilized;
   a first printed circuit board with first and second elongated condenser plates etched thereon end to end in a straight line and electrically isolated from each other;
   said first condenser plate connected to receive the output of said first demodulating means after it has been modulated and said second condenser plate connected to receive the output of said first inverter means;
   a second printed circuit board with a condenser plate etched thereon;
   a first sheet of dielectric material, a grounded metallic shield and a second sheet of dielectric material sandwiched between said first and second printed circuit boards;
   shaft means attached to said dial and to said metallic shield for rotating the shield about a non-center point on the shield as said dial is rotated whereby the signal on said condenser plate on said second printed circuit board is said sin signal.

9. A device according to claim 8 wherein said means for generating said cos signal and for summing said sin signal and said cos signal comprises:
   third and fourth elongated condenser plates etched on said first printed circuit board end to end in a straight line perpendicular to and crossing the line of said first and second condenser plates and electrically isolated from each other and from said first and second condenser plates;
   said third condenser plate connected to receive the output of said second demodulating means after it has been modulated and said fourth condenser plate connected to receive the output of said second inverter means whereby the signal on said condenser plate on said second printed circuit board is the sum of said sin signal and said cos signal.

10. A device according to claim 9 wherein said condenser plate on said second printed circuit board is in the shape of a cruciform to correspond to the combined shape of the first, second, third and fourth condenser plates on said first printed circuit board.

11. In a device for generating a signal indicative of the difference between the actual heading and the selected heading of a vehicle in which two magnetometers are mounted on the vehicle in a horizontal plane during normal movement of the vehicle with the sensing elements of the magnetometers at an angle with each other and means for demodulating the outputs of the two magnetometers, a device for vectorially summing the two demodulated signals to produce a resultant signal that is a function of the error in the heading of the vehicle comprising:
   inverter means for inverting the two signals from said demodulating means;

a first linear potentiometer with one end of the potentiometer connected to receive a demodulated signal and with its other end connected to receive the corresponding inverted signal;

a second linear potentiometer with one end of the potentiometer connected to receive the other demodulated signal and with its other end connected to receive the corresponding inverted signal;

a dial;

a first shaft attached to be rotated with said dial;

a second shaft;

a crank means attached to said first and second shafts such that the second shaft is parallel to, offset from and revolves around the centerline extended of said first shaft as the first shaft rotates;

means for attaching the slider arm of said first linear potentiometer to said second shaft to be controlled by the movement of said second shaft;

means for attaching the slider arm of said second linear potentiometer to said second shaft to be controlled by the movement of said second shaft wherein the slider arms of said first and second potentiometers are perpendicular to each other; and means for summing the signals at the sliders of said first and said second potentiometers.

12. A device for generating a signal indicative of the difference between the actual heading and the selected heading of a vehicle comprising:

first and second magnetometers mounted on the vehicle in a horizontal plane during normal movement of the vehicle and with the sensing elements of the magnetometers at an angle with each other;

first inverter means for inverting the output of said first magnetometer;

second inverter means for inverting the output of said second magnetometer;

a dial calibrated in the points of a compass for selecting the heading of the vehicle;

means receiving the outputs of said first magnetometer and said first inverter means and under the control of said dial for generating a sin signal proportional to the output of said first magnetometer times the sin of the angle through which said dial is rotated;

wherein said means for generating a sin signal comprises:

a first printed circuit board with first and second elongated condenser plates etched thereon end to end in a straight line and electrically isolated from each other;

said first condenser plate connected to receive the output of said first magnetometer and said second condenser plate connected to receive the output of said first inverter means, a second printed circuit board wth a condenser plate etched thereon, a first sheet of dielectric material, a grounded metallic shield and a second sheet of dielectric material sandwiched between said first and second printed circuit boards, and shaft means attached to said dial and to said metallic shield for rotating the shield about a non-center point on the shield as said dial is rotated whereby the signal on said condenser plate on said second printed circuit board is said sin signal;

means receiving the outputs of said second magnetometer and said second inverter means and under the control of said dial for generating a cos signal proportional to the outpt of said second magnetometer times the cos of the angle through which said dial is rotated; and means for summing said sin signal and said cos signal to produce said signal indicative of the difference between the actual heading and the selected heading of the vehicle.

13. In a device for generating a signal indicative of the difference between the actual heading and the selected heading of a vehicle in which two magnetometers are mounted on the vehicle in a horizontal plane during normal movement of the vehicle with the sensing elements of the magnetometers at an angle with each other and means for demodulating the outputs of the two magnetometers, means including a polarized light resolver with a dial for vectorally summing the two demodulated signals to produce a resultant signal that is a function of the error in heading of the vehicle comprising:

a first polarized light resolver means including said polarized light resolver receiving one of said demodulated signals for generating a sin function signal proportional to said one of said demodulated signals times the sin of the angle through which said dial is rotated;

a second polarized light resolver means including said polarized light resolver receiving the other of said demodulated signals for generating a cos function signal proportional to said other of said demodulated signals times the cos of the angle through which said dial is rotated; and means for summing said sin and cos function signals to produce said resultant signal.

14. In a device as in claim 13 wherein one of said sensing elements is mounted perpendicular to the roll axis of said vehicle and the other of said sensing elements is mounted perpendicular to said one of said sensing elements.

15. In a device as in claim 13 wherein each of said first and second polarized resolver means comprises:

first and second photoresistive elements connected in series with the corresponding demodulated signal connected to an end of the resulting series circuit;

means for inverting the corresponding demodulated signal and connecting it to the other end of said series circuit;

a light source for illuminating said first and second photoresistive elements;

a first sheet of linearly polarized filter material covering said first photoresistive element;

a second sheet of linearly polarized filter material, with an axis of polarization perpendicular to the axis of polarization of said first sheet, covering said second photoresistive element;

a third sheet of linearly polarized filter material located between and light source and said first and second sheets of linearly polarized filter material; and means for rotating said third sheet of linearly polarized material to select the heading of said vehicle.

16. In a device as in claim 15 wherein the first and second sheets of linearly polarized filter material in said first polarized light resolver have axes of polarization that make 45° angles with the axes of polarization of said first and second sheets in said second polarized light resolver.

17. In a device as in claim 16 wherein said third sheet of linearly polarized filter material for said first and second polarized light resolver means is a single sheet which serves as the said third sheet for both resolver means.

18. In a device as in claim 17 including means for rotating said single sheet to select the heading of said vehicle comprising a dial calibrated in the points of a compass, and shaft means including a 2:1 gear ratio connected between said dial and said single sheet for rotating said single sheet.

19. In a device as in claim 17 including means for summing the two voltage at the junctions of said first and second photoresistive elements for both said first and second polarized light resolver means.

20. In a device for generating a signal indicative of the difference between the actual heading and the selected heading of a vehicle in which two magnetometers are mounted on the vehicle in a horizontal plane during normal movement of the vehicle with the sensing elements of the magnetometers at an angle with each other, a device for vectorially summing the two magnetometer signals to produce a resultant signal that is a function of the error in heading of the vehicle comprising:

- a first printed circuit board with four elongated condenser plates etched thereon in the shape of a cruciform and electrically isolated from each other;
- a second printed circuit board with a condenser plate etched thereon in the shape of a cruciform;
- a first sheet of dielectric material, a grounded metallic shield and a second sheet of dielectric material sandwiched between said first and second printed circuit boards;
- a dial; and
- shaft means attached to said dial and to said metallic shield for rotating the shield about a non-center point on said shield as said dial is rotated whereby the signal on the condenser plate on said second printed circuit board is said resultant signal.

* * * * *